United States Patent [19]
Kumamoto et al.

[11] Patent Number: 5,821,893
[45] Date of Patent: Oct. 13, 1998

[54] PIPELINE TYPE A/D CONVERTER

[75] Inventors: Toshio Kumamoto; Osamu Matsumoto, both of Hyogo, Japan

[73] Assignee: Mitsubishi Denki Kabushiki Kaisha, Tokyo, Japan

[21] Appl. No.: 740,520

[22] Filed: Oct. 30, 1996

[30] Foreign Application Priority Data

Apr. 5, 1996 [JP] Japan .................................. 8-083841

[51] Int. Cl.⁶ .................................................. H03M 1/38
[52] U.S. Cl. ...................... 341/161; 341/118; 341/120; 341/156; 341/162
[58] Field of Search ..................... 341/161, 118, 341/120, 110, 156, 162

[56] References Cited

U.S. PATENT DOCUMENTS

| | | | |
|---|---|---|---|
| 4,894,656 | 1/1990 | Hwang et al. | 341/120 |
| 5,274,377 | 12/1993 | Matsuura et al. | 341/161 |
| 5,635,937 | 6/1997 | Lim et al. | 341/161 |

OTHER PUBLICATIONS

Tatsuji Matsuura, et al: "1.2V Mixed Analog/Digital Circuits Using 0.3um CMOS LSI Technology", 1994 IEEE International Solid–State Circuits Conference, pp. 250–251.

*Primary Examiner*—Jeffrey A. Gaffin
*Assistant Examiner*—Jason L.W. Kost
*Attorney, Agent, or Firm*—McDermott, Will & Emery

[57] ABSTRACT

In a pipeline type A/D converter, a switch for sampling an analog potential signal has its other terminal in connection with an A/D converter, a D/A converter, a capacitor for subtraction. Even when frequency of the analog potential signal is raised such that input current is increased and a voltage drop is increased at the switch, there will be no error in the result of subtraction like in the conventional example where analog potential signal was directly input to A/D converter. Accordingly, a pipeline type A/D converter with low power dissipation and satisfactory frequency characteristics is obtained.

6 Claims, 6 Drawing Sheets

SAMPLING PERIOD

COMPARING PERIOD

PIPELINE TYPE A/D CONVERTER

BACKGROUND OF THE INVENTION

1. Field of the Invention

The present invention relates to a pipeline type A/D converter, and particularly to a pipeline type A/D converter which operates in synchronization with a clock signal to convert analog voltage input to an input terminal into a digital code of a prescribed number of bits.

2. Description of the Background Art

FIG. 6 is a circuit block diagram showing a structure of a conventional pipeline type A/D converter. Such a pipeline type A/D converter is disclosed in, for example, ISSCC '94, pp. 250–251, "1.2V Mixed Analog/Digital Circuits Using 0.3 μm CMOSLSI Technology."

Referring to FIG. 6, this pipeline type A/D converter includes a sample-and-hold circuit 71 and subtracting circuits 42 to 74 connected in series, A/D converters 81 to 84, D/A converters 91 to 93 and a logic circuit 85.

Sample-and-hold circuit 71 includes switches S71 to S73, capacitors 74 and 75, and an amplifier 76. One electrode of capacitor 74 receives analog potential signal Vin via switch S71 while receiving ground potential GND via switch S72. The other electrode of capacitor 74 is connected to an input node of amplifier 76. Switch S73 and capacitor 75 are connected between input and output nodes of amplifier 76, respectively.

Upon operation, switches S71, S73 are rendered conductive while switch S72 is rendered non-conductive, and analog potential signal Vin is sampled by capacitor 74. Then, switches S71 and S73 are rendered non-conductive while switch S72 is rendered conductive, and the analog potential sampled by capacitor 74 is held at ground potential GND. The held potential, that is, an output potential VS1 of amplifier 76, is provided to A/D converter 81 and subtracting circuit 72.

A/D converter 81 performs an A/D conversion of output potential VS1 of sample-and-hold circuit 71 with a coarse resolution (3 bits), and provides a digital code D1 of 3 bits to D/A converter 91 and logic circuit 85. D/A converter 91 provides digital code D1 from A/D converter 81 into analog potential VDA1 again and applies it to subtracting circuit 72.

The structure of subtracting circuit 72 is the same as that of sample-and-hold circuit 71 except for that it receives output potential VS1 of sample-and-hold circuit 71 and output potential VDA1 of D/A converter 91 instead of analog potential signal Vin and ground potential GND.

During the period in which output potential VS1 of sample-and-hold circuit 71 is held, switches S71 and S73 are rendered conductive while switch S72 is rendered non-conductive, and VS1 is sampled by capacitor 74. During the period in which output potential VDA1 of conductive D/A converter 91 is determined, switch S71 and S73 are rendered non-conductive while switch S72 is rendered conductive, and VDA1 is subtracted from VS1 which has been sampled by capacitor 74.

Output voltage VS2=VS1−VDA1 is provided to A/D converter 82 as well as to subtracting circuit 73. A/D converter 82 performs an A/D conversion of VS2 with a fine resolution (3 bit), and provides a digital code D2 of 3 bits to D/A converter 92 as well as to logic circuit 85. D/A converter 92 converts digital code D2 into analog potential VDA2 again and applies it to subtracting circuit 73.

Further process is carried on in a similar manner so as to perform subtraction, A/D conversion, D/A conversion, subtraction and then A/D conversion at subtracting circuit 73, A/D converter 83, D/A converter 93, subtracting circuit 74 and A/D converter 84 such that additional two digital codes D3 and D4 are produced. Logic circuit 85 produces a 9 bit digital code D0 in view of the weight and the timing of each of A/D converters 81 to 84.

Thus, in a conventional pipeline type A/D converter, sample-and-hold circuit 71 samples and holds analog potential VS1 at a prescribed timing such that circuits other than sample-and-hold circuit 71 can perform an A/D conversion of the held potential VS1 and can perform a highly accurate A/D conversion regardless of the level of frequency of analog potential signal Vin.

Since usage of sample-and-hold circuit 71 leads to increase in power dissipation, it is desired to eliminate this circuit 71. However, if sample-and-hold circuit 71 is eliminated, analog potential signal Vin would be changed while A/D converter 81 of the first stage is still performing its A/D conversion, and therefore, result of subtraction obtained would not be accurate. Accordingly, potential VS2 conducted to A/D converter 82 of the second stage would include errors, degrading the accuracy of the pipeline type A/D converter as a whole. To deal with this problem, A/D converter 81 and subtracter 72 have their sampling timings matched.

However, even in a structure as mentioned above, rise in frequency of input signal Vin will cause input current to flow through switch S71, capacitor 74 and switch S73, leading to a voltage drop due to this current and conducting resistance value of switch S71.

When frequency of input signal Vin is made higher, impedance of capacitor 74 is reduced, and accordingly, input current is increased making the voltage drop occurring at switch S71 larger, and input signal Vin with errors included is sampled by capacitor 74. In addition, since the conducting resistance of switch S71 is changed non-linearly with respect to the applied voltage, the influence of such errors is significant.

Accordingly, the difference between the signal input to A/D converter 81 of the first stage and the signal sampled by capacitor 74 in subtracter 72 of the first stage is made larger as the frequency of input signal Vin increases, causing significant errors to occur in the result of subtraction.

SUMMARY OF THE INVENTION

Based upon the foregoing, it is a main object of the present invention to provide a pipeline type A/D converter with low power dissipation and satisfactory frequency characteristics.

Briefly speaking, in a first pipeline type A/D converter according to the present invention, a first A/D converter, a D/A converter and a subtracting circuit are all connected to the other input of a first switch. Accordingly, even when frequency of an analog voltage signal is made higher to increase input current which causes increase in voltage drop at the first switch, there will be no errors in the result of subtraction like in the conventional example where the first A/D converter was connected to one terminal of the first switch. Therefore, a satisfactory frequency characteristics can be obtained.

Preferably, the subtracting circuit includes a capacitor and a third switch. Thus, the subtracting circuit can be formed more easily.

Also, it is preferred that the first A/D converter includes a first voltage generating circuit, a plurality of first voltage comparing circuits and a first encoder, that the D/A converter includes a fourth switch, and that a second A/D converter includes a second voltage generating circuit, a plurality of second voltage comparing circuits and a second encoder. Thus, the first A/D converter, the D/A converter and the second A/D converter can be formed more easily.

In addition, briefly speaking, a second pipeline type A/D converter according to the present invention is obtained by providing the first pipeline type A/D converter as a differential structure. Accordingly, it is possible to eliminate the noises, such that A/D conversion can be performed with higher accuracy.

It is preferred that a first A/D converter includes a reference potential generating circuit, a plurality of potential comparing circuits and a first encoder, that the D/A converter includes a sixth switching circuit, and that a second A/D converter includes a reference voltage generating circuit, a voltage comparing circuit and a second encoder. Thus, the first A/D converter, the D/A converter and the second A/D converter can be formed more easily.

It is also preferred that a seventh switch is additionally provided, which switch being connected in parallel with the second switch and rendered conductive during a period in which a clock signal is at a second potential. Thus, it is possible to cancel the noise generated by the sixth switch such that A/D conversion can be performed with even higher accuracy.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
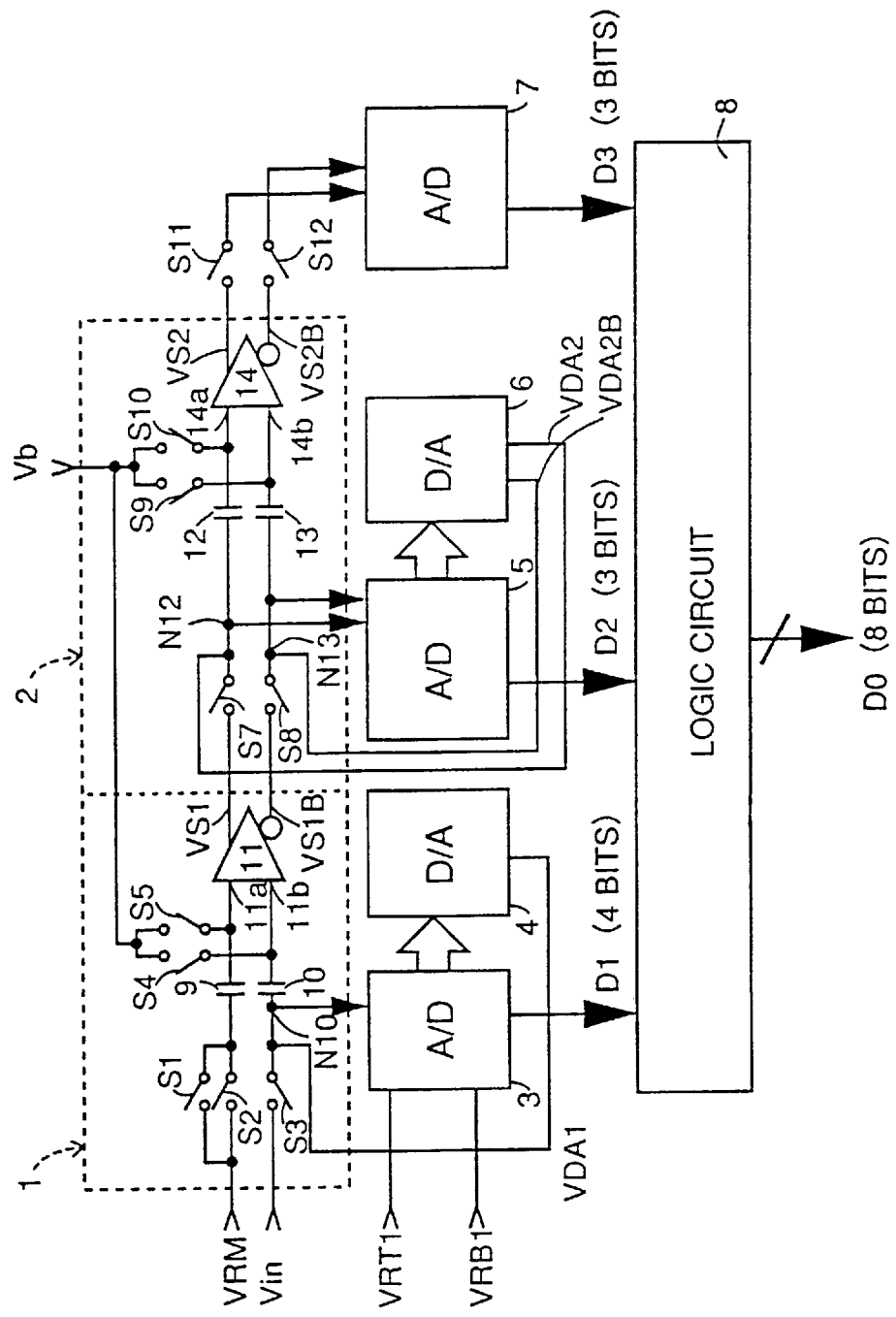
FIG. 1 is a circuit block diagram showing a structure of a pipeline type A/D converter according to one embodiment of the present invention.

FIG. 1 is a block diagram showing the structure of a pipeline type A/D converter according to one embodiment of the present invention. Referring to FIG. 1, this pipeline type A/D converter includes subtracting circuits 1 and 2, switches S11 and S12, A/D converters 3, 5 and 7, D/A converters 4 and 6, and a logic circuit 8.

Subtracting circuit 1 includes switches S1 to S5, capacitors 9 and 10, and a differential amplifier 11. Each of switches S1 to S5 is formed by an MOS transistor. One electrode of capacitor 9 receives a reference potential VRM via switch S2. Switches S1 and S2 are connected in parallel. The other electrode of capacitor 9 is connected to one input node 11a of differential amplifier 11 and receives bias potential Vb via switch S5.

One electrode (node N10) of capacitor 10 receives an analog potential signal Vin via switch S3. The other electrode of capacitor 10 is connected to the other input node 11b of differential amplifier 11 and receives bias voltage Vb via switch S4.

Upon operation, switches S2 to S5 are rendered conductive first while switch S1 is rendered non-conductive, and reference potential VRM and analog potential signal Vin are sampled by capacitors 9 and 10, respectively. Then, switch S1 is rendered conductive while switch S2 to S5 are rendered non-conductive during the period in which output potential VDA of D/A converter 4 is determined, and VDA1 is subtracted from analog potential Vin sampled by capacitor 10.

Figure 2:
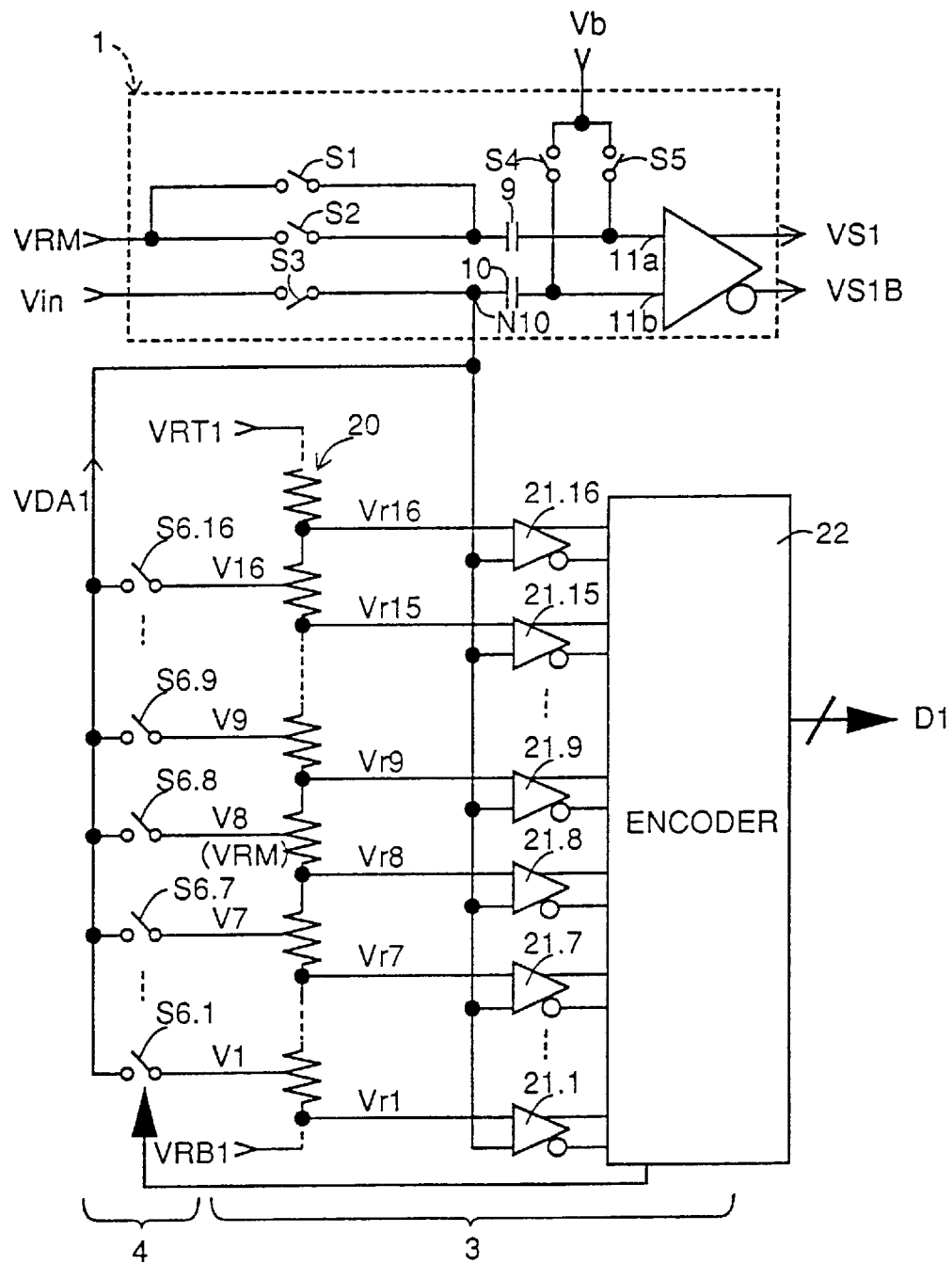
FIG. 2 is a partially omitted circuit block diagram showing the specific structure of A/D converter 3 and D/A converter 4 in FIG. 1.

As shown in FIG. 2, A/D converter 3 includes a reference potential generating circuit 20 including multiple resistance elements connected in series, potential comparing circuits 21.1 to 21.16 and an encoder 22. Reference potential generating circuit 20 divides the voltage between two reference potentials VRT1 and VRB1 to produce reference potentials Vr1 to Vr16 for comparison respectively corresponding to 16 (4 bit) digital codes as well as reference potentials V1 to V16 for subtraction respectively corresponding to 16 digital codes. Reference potentials Vr1 to Vr16 for comparison are provided to potential comparators 21.1 to 21.16, respectively. Reference potentials V1 to V16 for subtraction are provided to D/A converter 4. Reference potential V8 is also provided to subtracting circuit 1 as VRM.

Potential comparators 21.1 to 21.16 compare reference potentials Vr1 to Vr16, respectively, with sampled analog potential Vin, and output signals corresponding to the result of comparison to encoder 22. Encoder 22 selects one of the 16 digital codes according to the signal applied from potential comparators 21.1 to 21.16, and provides that selected digital code D1 to logic circuit 8.

D/A converter 4 includes switches S6.1 to S6.16 provided corresponding to 16 digital codes, respectively. Each of switches S6.1 to S6.16 are formed by an MOS transistor. Each of switches S60. to S6.16 has its one electrode provided with one of reference potentials V1 to V16 for subtraction. The other electrodes of switches S6.1 to S6.16 are commonly connected to node N10 between switch S3 and capacitor 10.

Among switches S6.1 to S6.16, only the one corresponding to digital code D1 selected by encoder 22 (for example, S6.9) is rendered conductive simultaneously with switch S1 of subtracting circuit 1. Switch S1 and this switch (S6.9 in this case) are rendered conductive simultaneously in order to superimpose the same noise on two input nodes 11a and 11b of differential amplifier 11 such that occurrence of noise at output voltage ΔVS1 =VS1−VS1B of differential amplifier 11 is prevented. Complementary output potentials VS1 and VS1B of differential amplifier 11 are input to subtracting circuit 2.

Subtracting circuit 2 includes switches S7 to S10, capacitors 12, 13, and differential amplifier 14. Each of the capacitors 11 and 13 has its one electrode (node N12, N13) provided with one of complementary output potentials VS1 and VS1B of differential amplifier 11 in subtracting circuit 1 of previous stage via switch S7 or S8. The other electrodes of capacitors 12 and 13 are connected to input nodes 14a and 14b of differential amplifier 14, respectively, and receive a bias voltage Vb via switches S10 and S9, respectively.

Switches S7 to S10 are rendered conductive during the period in which output potentials VS1 and VS1B of differential amplifier 11 is determined, and VS1 and VS1B are sampled by capacitors 12 and 13, respectively. Then, switches S7 to S10 are rendered non-conductive during the period in which output potentials VDA2 and VDA2B of D/A converter 6 are determined, and VDA2 and VDA2B are subtracted from VS1 and VS1B, respectively.

Figure 3:
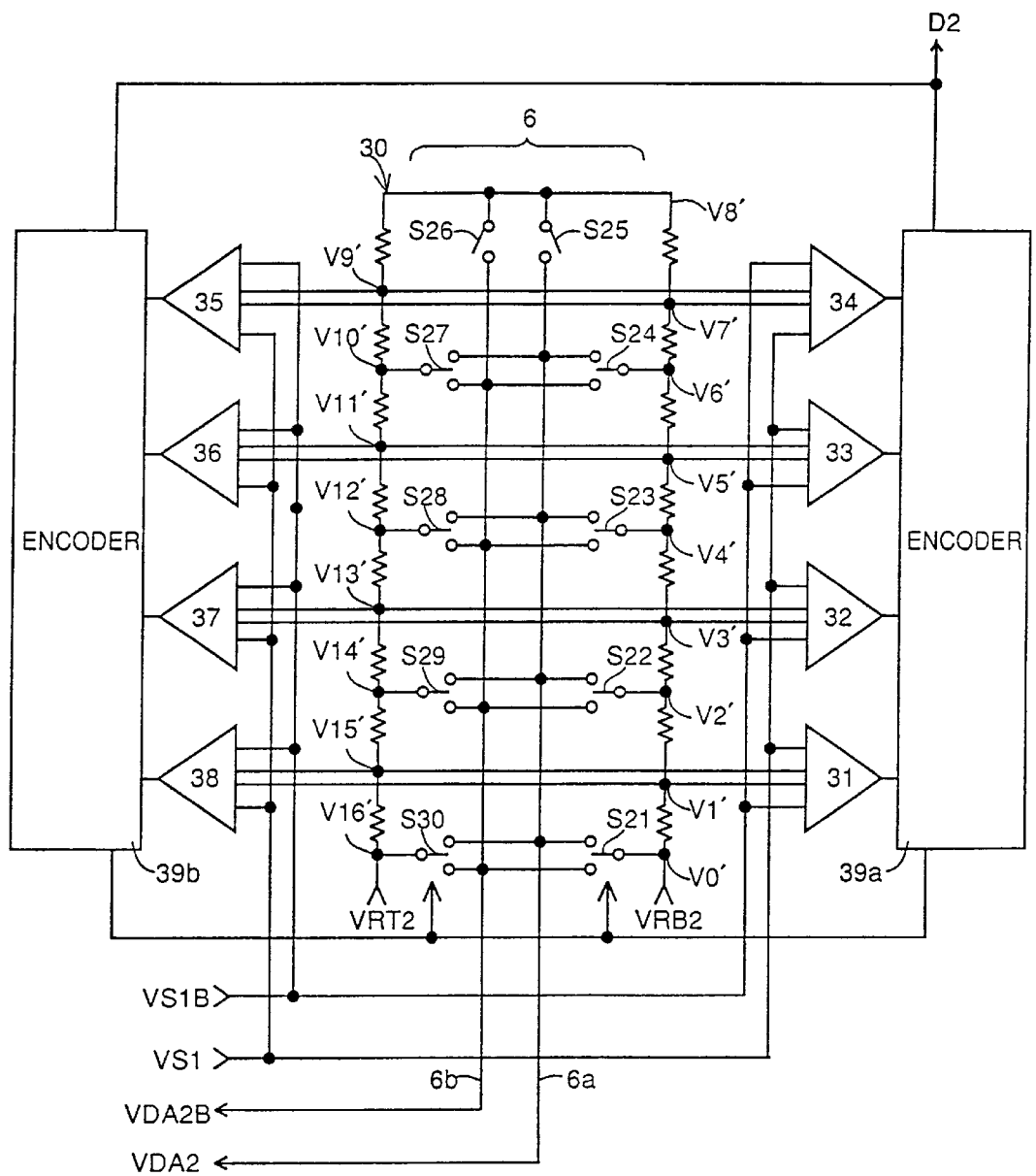
FIG. 3 is a circuit block diagram showing the specific structure of A/D converter 5 and D/A converter 6 in FIG. 1.

FIG. 3 is a circuit block diagram showing the structure of A/D converter 5 and D/A converter 6 of FIG. 1. Referring to FIG. 3, A/D converter 5 includes a reference potential generating circuit 30 including a plurality of resistance elements connected in series, voltage comparing circuits 31 to 38, and encoders 39a and 39b.

Reference potential generating circuit 30 divides the voltage between two externally applied reference potentials VRT2 and VRB2 to generate reference potentials V0' to V16'. Eight reference voltages V15'–V1', V13'–V3', V11'–V5', V9'–V7', V7'–V9', V5'–V11', V3'–V13', V1'–V15' for comparison respectively corresponding to eight (3 bit) digital codes in accordance with the interconnection are generated, and are provided to voltage comparing circuits 31 to 38, respectively. Reference potentials V0', V2', V4', ..., V16' are provided to D/A converter 6.

Voltage comparing circuits 31 to 38 compare reference voltages V15'–V1', V13'–V3', ..., V1'–V15' for comparison and output voltage ΔVS1=VS1–VS1B of differential amplifier 11 of the previous stage, respectively, and output signals corresponding to the result of comparison to encoders 39a and 39b.

Figure 4A:
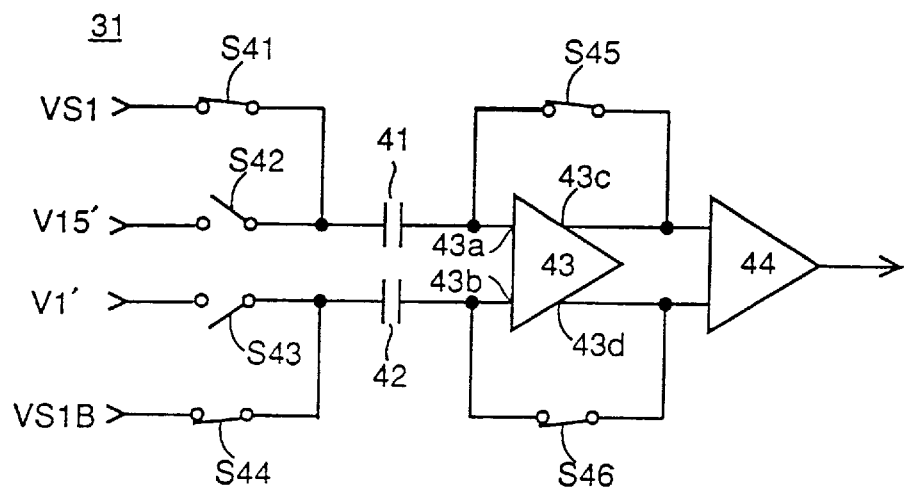
FIG. 4A is a circuit block diagram for illustrating the structure and operation during the sampling period of the voltage comparing circuit shown in FIG. 3.
Figure 4B:
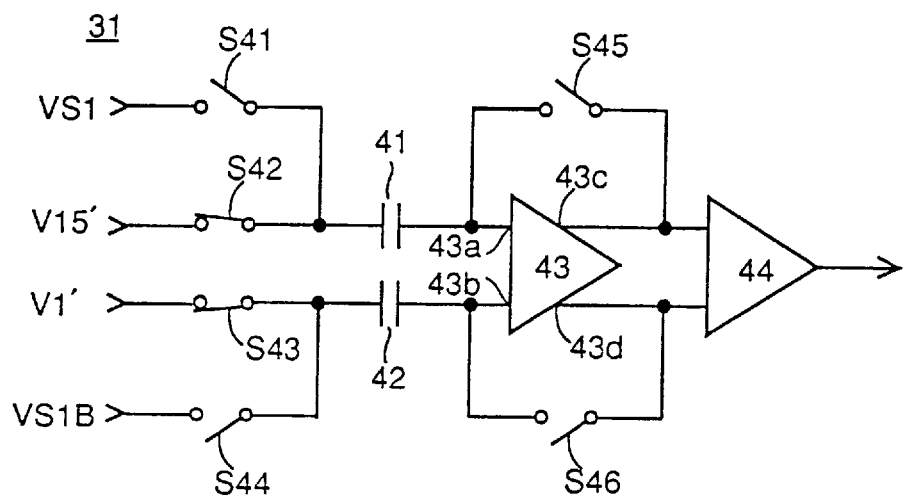
FIG. 4B is a circuit block diagram for illustrating the structure and operation during the comparing period of the voltage comparing circuit shown in FIG. 3.

More particularly, voltage comparing circuit 31 includes switches S41 to S46, capacitors 41 and 42, a differential amplifier 43 and a potential comparing circuit 44, as shown in FIGS. 4A and 4B. Each of switches S41 to S46 is formed of an MOS transistor. One electrode of capacitor 41 receives VS1 and V15' via switches S41 and S42, respectively. Its other electrode is connected to one input node 43a of differential amplifier 43. One electrode of capacitor 42 receives V1' and VS1B via switches S43 and S44, respectively, and its other electrode is connected to the other input node 43b of differential amplifier 43. Switch S45 is connected between one input node 43a and one output node 43c of differential amplifier 43, and switch S46 is connected between the other input node 43b and the other output node 43d of differential amplifier 43. Potential comparator 44 compares two output potentials of differential amplifier 43.

During the sampling period, switches S41 and S44 to S46 are rendered conductive while switches S42 and S43 are rendered non-conductive as shown in FIG. 4A, and VS1, VS1B are respectively sampled by capacitors 41, 42.

During the comparing period, switches S41 and S44 to S46 are rendered non-conductive while switches S42 and S43 are rendered conductive as shown in FIG. 4B, and V15', V1' are respectively subtracted from VS1, VS1B which have been sampled by capacitor 41, 42. Potential comparator 44 makes a comparison between VS1–V15' and VS1B–B1', that is, VS1–VS1B and V15'–V1', and applies a signal corresponding to the result of comparison to encoder 39a. Similar process is also carried on for other voltage comparing circuits 32 to 38.

Encoder 39 selects one of the eight digital codes in accordance with the signals applied from voltage comparing circuits 31 to 38, and provides that selected digital code D2 to logic circuit 8.

D/A converter 6 includes shift switches S21 to S24, S27 to S30 as well as switches S25 and S26. Each of switches S21 to S30 are formed by MOS transistors. Common terminals of shift switches S21 to S24, S27 to S30 receive reference voltages V0', V2', V4', V6', V10', V12', V14', V16', respectively, and each one shift terminal is commonly connected to one output node 6a of D/A converter 6 while the other shift terminals of each switches are commonly connected to the other output node 6b of D/A converter 6. Each of switches S25 and S26 has its one terminal provided with reference potential V8', and the other terminal connected to either output node 6a or 6b of D/A converter 6.

Switches S21 to S30 generate a reference potential pair which corresponds to selected digital code D2 among eight reference potential pairs V16' and V0', V14' and V2', V12' and V4', V10' and V6', V6' and V10', V4' and V12', V2' and V14', V15' and V16' for subtraction corresponding to eight digital codes, respectively, and provides this reference potential pair to nodes N12, N13 of subtracting circuit 2.

Complementary output potentials VS2 and VS2B of differential amplifier 14 is input to A/D converter 7 via switches S11 and S12, respectively. Switches S11 and S12 are rendered conductive during the period in which outputs V2, VS2B of differential amplifier 14 is determined. A/D converter 7 of the last stage is of the same structure as that of A/D converter 5. A/D converter 7 converts output voltage ΔVS2=VS2–VS2B of differential amplifier 14 into a 3 bit digital code D3 and provides it to logic circuit 8.

Figure 5:
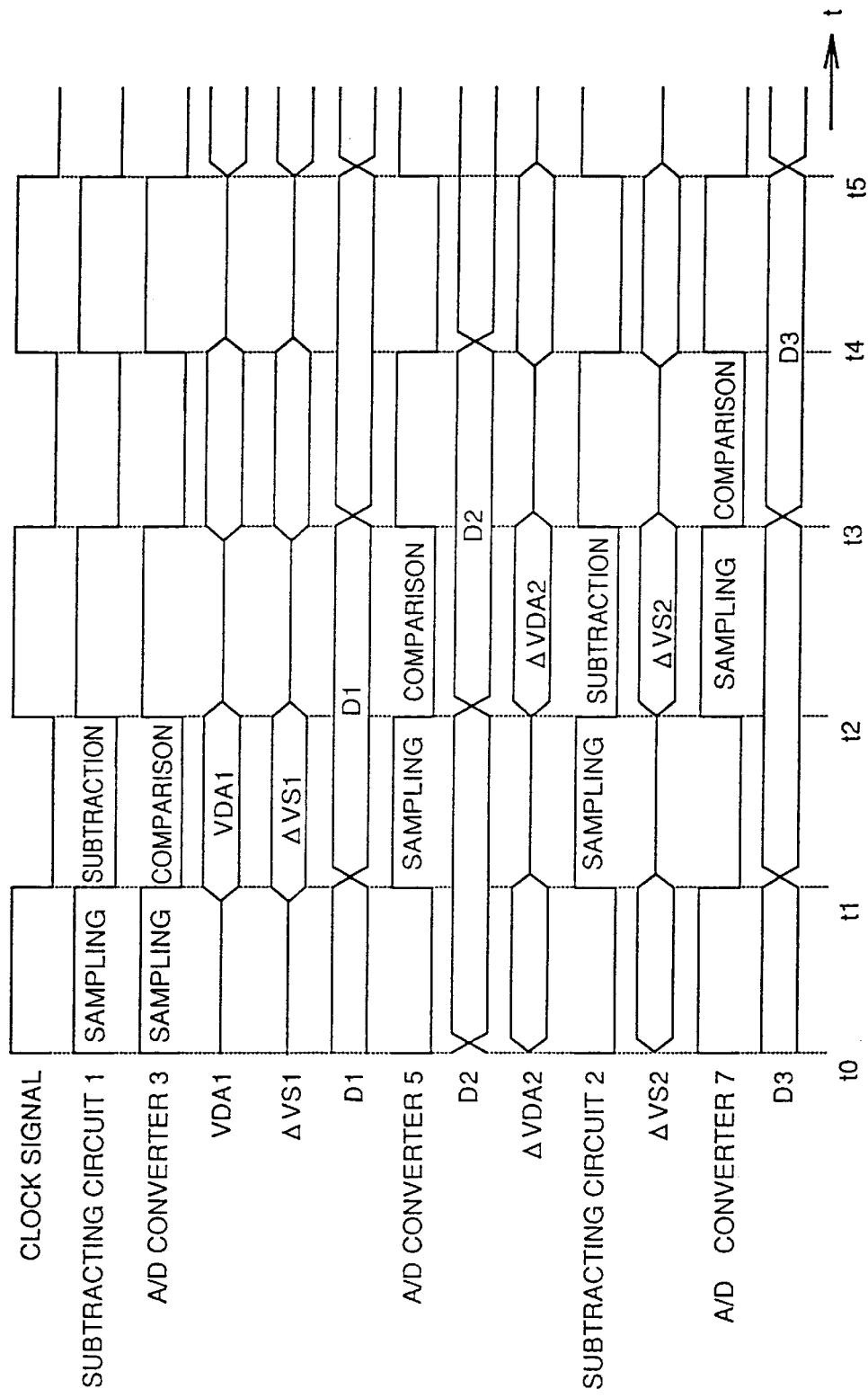
FIG. 5 is a timing chart for illustrating the operation of the pipeline type A/D converter shown in FIGS. 1 to 4.
Figure 6:
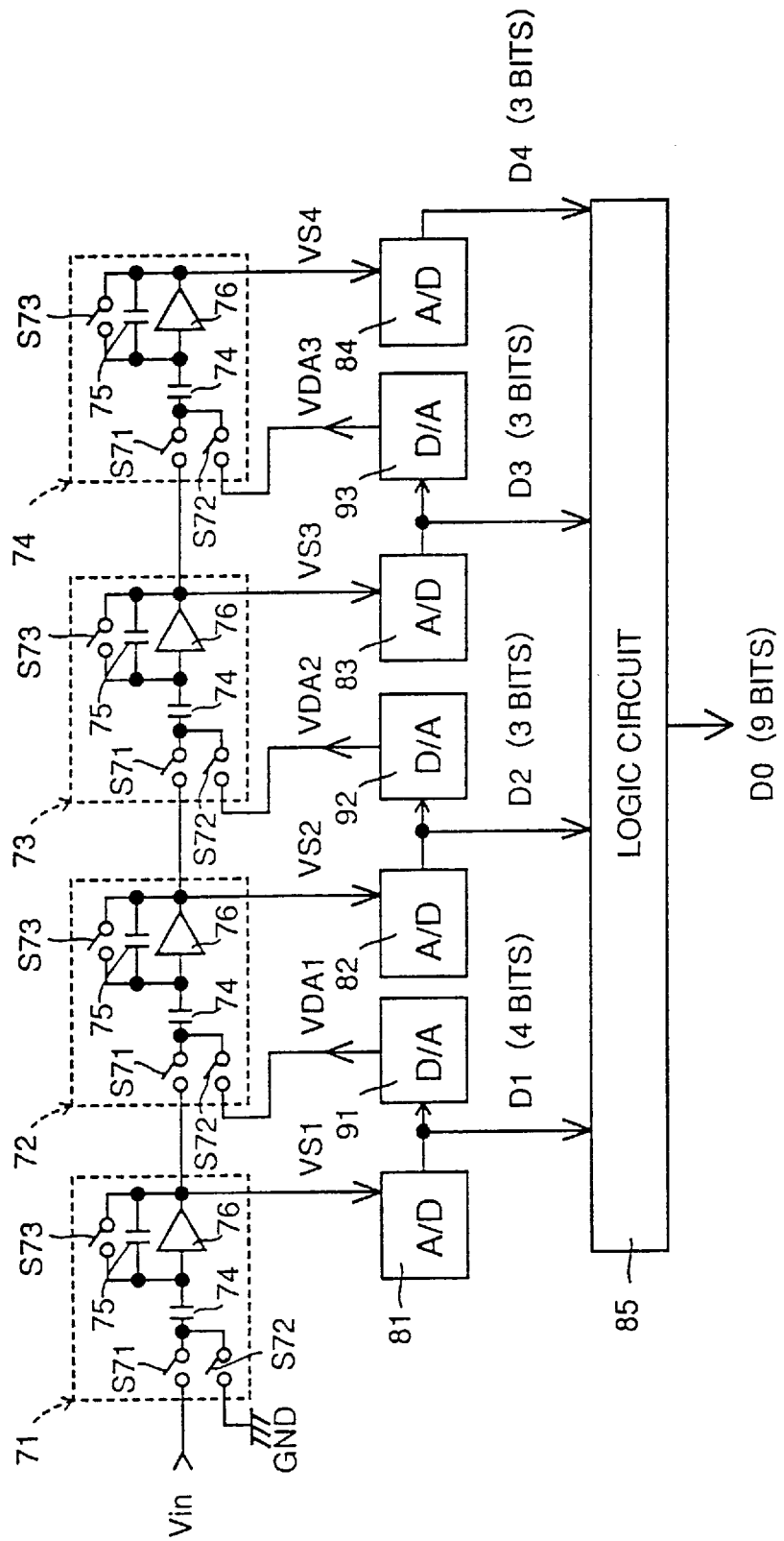
FIG. 6 is a circuit block diagram showing a structure of a conventional pipeline type A/D converter.

FIG. 5 is a timing chart for illustrating the operation of the pipeline type A/D converter shown in FIGS. 1 to 4. Referring to FIG. 5, this pipeline type A/D converter operates in synchronization with a clock signal having a constant cycle.

During the period t0–t1 in which clock signal is at "H" level, switches S2 to S5 of subtracting circuit 1 are rendered conductive and analog potential signal Vin is sampled.

During the period t1–t2 in which clock signal is at "L" level, A/D converter 3 converts analog potential Vin which has been sampled in period t0–t1 into digital code D1. D/A converter 4 outputs analog potential VDA1 corresponding to digital code D1, and subtracting circuit 1 subtracts VDA1 from analog potential Vin. The result of this subtraction Vin–VDA1 and reference potential VRM are converted into complementary output potentials VS1 and VS1B by differential amplifier 11 and are input to subtracting circuit 2 of the next stage. In addition, switches S7 to S10 of subtracting circuit 2 are rendered conductive and sampling of output voltage ΔVS1 of differential amplifier 11 is performed.

During the period t2–t3 in which clock signal is at "H" level, A/D converter 5 converts ΔVS1 which has been sampled in period t1–t2 into digital code D2. D/A converter 6 outputs an analog voltage ΔVDA2=VDA2–VDA2B corresponding to digital code D2, and subtracting circuit 2 subtracts ΔVDA from ΔVS1. The result of this subtraction is converted into complementary output potentials VS2, VS2B by differential amplifier 14. In addition, switches S11 and S12 are rendered conductive and sampling of output voltage ΔVS2 of differential amplifier 14 is performed.

During the period t3–t4 in which clock signal is at "L" level, A/D converter 7 converts ΔVS2 which has been sampled in period t2–t3 into digital code D3. Logic circuit 8 generates an 8 bit digital code D0 in accordance with digital codes D1 to D3.

In the present embodiment, switch S3 for sampling analog potential signal Vin has its other terminal (node N10) connected to A/D converter 3, D/A converter 4 and capacitor 10 for subtraction. Accordingly, even when frequency of analog potential signal Vin is made higher causing increase in input current and increase in voltage drop at switch S3, there would be no error in the result of subtraction Vin−VDA1 as in the conventional example where analog potential signal Vin had been input directly to A/D converter 3.

In addition, since the differential structure is adopted, it is possible to eliminate the noise such that A/D conversion of higher accuracy can be performed.

Although the present invention has been described and illustrated in detail, it is clearly understood that the same is by way of illustration and example only and is to be taken by way of limitation, the spirit and scope of the present invention being limited only by the terms of the appended claims.

What is claimed is:

1. A pipeline type A/D converter operating in synchronization with a clock signal for converting analog voltage input to an input terminal into a digital code of a prescribed number of bits, comprising:

first switching means having one of its terminals connected to said input terminal, being rendered conductive during a period in which said clock signal is at a first potential for sampling said analog voltage;

a first A/D converter connected to the other terminal of said first switching means for converting the analog voltage sampled by said first switching means into a first digital code during a period in which said clock signal is at a second potential;

a D/A converter for converting the first digital code generated by said first A/D converter into analog voltage during a period in which said clock signal is at the second potential;

subtracting means connected to the other terminal of said first switching means for subtracting the analog voltage generated by said D/A converter from the analog voltage sampled by said first switching means during a period in which said clock signal is at the second potential;

second switching means receiving at one of its terminals the analog voltage output from said subtracting means, being rendered conductive during a period in which said clock signal is at the second potential for sampling the analog voltage;

a second A/D converter connected to the other terminal of said second switching means for converting the analog voltage sampled by said second switching means into a second digital code during a period in which said clock signal is at the first potential; and a logic circuit for generating said digital code of the prescribed number of bits according to said first and second digital codes generated by said first and second A/D converters.

2. The pipeline type A/D converter in accordance with claim 1, wherein said subtracting means includes:

a capacitor having one of its electrodes connected to the other terminal of said first switching means; and a third switching means receiving at one of its terminals a reference voltage for biasing and having its other terminal connected to the other electrode of said capacitor, being rendered conductive during a period in which said clock signal is at the first potential to charge said capacitor.

3. The pipeline type A/D converter in accordance with claim 2, wherein said first A/D converter includes:

a first voltage generating means for generating a plurality of first reference voltages for comparison respectively corresponding to a first plurality of digital codes and a plurality of reference voltages for subtraction respectively corresponding to said first plurality of digital codes;

a plurality of first voltage comparing means respectively provided corresponding to said plurality of first reference voltages for comparison for comparing the corresponding one of the first reference voltages for comparison and the analog voltage sampled by said first switching means; and a first encoder for selecting one of said first plurality of digital codes according to the result of comparison made by said plurality of first voltage comparing means to output the selected digital code as said first digital code, said D/A converter including a fourth switching means provided corresponding to each of the reference voltages for subtraction generated by said first voltage generating means receiving at its one terminal the corresponding reference voltage for subtraction and having its other terminal connected to the other terminal of said first switching means, rendered conductive in response to selection of the corresponding digital code by said first encoder, said second A/D converter including:

a second voltage generating means for generating a plurality of second reference voltages for comparison respectively corresponding to a second plurality of digital codes;

a plurality of second voltage comparing means respectively provided corresponding to said plurality of second reference voltages for comparison for comparing the corresponding reference voltage for comparison and the analog voltage sampled by said second switching means; and a second encoder for selecting one of said second plurality of digital codes according to the result of comparison by said plurality of second voltage comparing means to output the selected digital code as said second digital code.

4. A pipeline type A/D converter operating in synchronization with a clock signal for converting an analog potential input at an input terminal into a digital code of a prescribed number of bits, comprising:

first switching means having one of its terminals connected to said input terminal, being rendered conductive during a period in which said clock signal is at a first potential for sampling said analog voltage;

a second switching means receiving at one of its terminals a first reference potential, rendered conductive during a period in which said clock signal is at the first potential for canceling noise generated by said first switching means;

a first A/D converter connected to the other terminal of said first switching means for converting the analog potential sampled by said first switching means into a first digital code during a period in which said clock signal is at a second potential;

a D/A converter for converting the first digital code generated by said first A/D converter into analog voltage during a period in which said clock signal is at the second potential;

a first capacitor having one of its electrodes connected to the other electrode of said first switching means for subtracting the analog potential generated by said D/A converter from the analog potential sampled by said first switching means during a period in which said clock signal is at the second potential;

a second capacitor having one of its electrodes connected to the other electrode of said first switching means;

a third switching means receiving at one of its terminals a second reference potential and having its other terminal connected to the other electrodes of said first and second capacitors rendered conductive during a period in which said clock signal is at the first potential for charging said first and second capacitors;

a differential amplifier having its first and second input terminal respectively connected to the other terminals of said first and second switching means;

fourth and fifth switching means having each one of their electrodes respectively connected to first and second output terminals of said differential amplifier, being rendered conductive during a period in which said clock signal is at the second potential for sampling an output voltage of said differential amplifier;

a second A/D converter connected to the other terminals of said fourth and fifth switching means for converting the output voltage of said differential amplifier sampled by said fourth and fifth switching means into a second digital code during a period in which said clock signal is a the first potential;

a logic circuit for generating said digital code of the prescribed number of bits according to said first and second digital codes generated by said first and second A/D converters.

5. The pipeline type A/D converter in accordance with claim 4, wherein said first A/D converter includes:

reference potential generating means for generating a plurality of reference potentials for comparison respectively corresponding to a plurality of digital codes and a plurality of reference potentials for subtraction respectively corresponding to said plurality of digital codes;

a plurality of potential comparing means respectively provided corresponding to said plurality of reference potentials for comparison for comparing a corresponding one of the first reference voltage for comparison and the analog voltage sampled by said first switching means; and a first encoder for selecting one of said plurality of digital codes according to the result of comparison made by said plurality of potential comparing means to output the selected digital code, said D/A converter including sixth switching means provided corresponding to each of the reference potentials for subtraction generated by said reference potential generating means, receiving at one of its terminals the corresponding reference potential for subtraction and having its other terminal connected to the other terminal of said first switching means, rendered conductive in response to selection of the corresponding digital code by said first encoder;

said second A/D converter including reference potential generating means for generating a plurality of reference potentials for comparison respectively corresponding to a plurality of digital codes;

a plurality of voltage comparing means respectively provided corresponding to said plurality of reference voltages for comparison for comparing the corresponding reference voltage for comparison and the output voltage sampled by said fourth and fifth switching means; and a second encoder for selecting one of said plurality of digital codes according to the result of comparison made by said plurality of potential comparing means to output the selected digital code as said second digital code.

6. The pipeline type A/D converter in accordance with claim 5, further comprising seventh switching means connected in parallel with said second switching means, rendered conductive during a period in which said clock signal is at the second potential to cancel the noise generated by said sixth switching means.

* * * * *